United States Patent [19]
Or et al.

[11] Patent Number: 5,953,827
[45] Date of Patent: Sep. 21, 1999

[54] MAGNETRON WITH COOLING SYSTEM FOR PROCESS CHAMBER OF PROCESSING SYSTEM

[75] Inventors: David T. Or, Sunnyvale; David Huo, Campbell; J. Darrel Stickler, Palo Alto, all of Calif.

[73] Assignee: Applied Materials, Inc., Santa Clara, Calif.

[21] Appl. No.: 08/964,949

[22] Filed: Nov. 5, 1997

[51] Int. Cl.⁶ .................................................. F26B 17/24
[52] U.S. Cl. ................................................ 34/58; 34/92
[58] Field of Search .................................... 34/58, 92, 593, 34/594, 314, 317, 318, 326; 134/176, 199, 902; 204/192.12, 192.18, 298.18

[56] References Cited

U.S. PATENT DOCUMENTS

| | | | |
|---|---|---|---|
| 4,637,146 | 1/1987 | Motoki et al. | 34/58 |
| 4,651,440 | 3/1987 | Karl | 34/58 |
| 4,936,940 | 6/1990 | Kawasumi et al. | 34/58 X |
| 4,989,345 | 2/1991 | Gill, Jr. | 34/58 |
| 5,171,415 | 12/1992 | Miller et al. | 204/298.09 |
| 5,702,573 | 12/1997 | Biberger et al. | 204/192.12 |
| 9,030,264 | 2/1998 | Fu et al. | |
| 9,057,254 | 4/1998 | Mandrekar et al. | |

*Primary Examiner*—Henry Bennett
*Assistant Examiner*—Steve Gravini
*Attorney, Agent, or Firm*—Patterson & Assoc.

[57] ABSTRACT

A vacuum processing system has a process chamber with a rotating member, such as a magnetron in a physical vapor deposition (PVD) chamber, disposed near a surface, such as a target in a PVD chamber. The rotating member and the surface are cooled by a cooling fluid. The rotational motion of the rotating member induces the cooling fluid to circulate around the rotating member and between the surface and the rotating member, thus efficiently cooling the rotating member and the surface with a quickly flowing fluid.

The rotating member has a fluid conduit extending from the rotational center of the rotating member to the outer edge of the rotating member. The cooling fluid inside the fluid conduit is subject to a centrifugal force under the action of the rotational motion, so that the cooling fluid is induced to flow from the rotational center to the outer edge, thus forcing the cooling fluid to circulate.

23 Claims, 5 Drawing Sheets

MAGNETRON WITH COOLING SYSTEM FOR PROCESS CHAMBER OF PROCESSING SYSTEM

BACKGROUND OF THE INVENTION

1. Field of the Invention

The present invention generally relates to methods and apparatuses used in vacuum processing systems of the type used to fabricate integrated circuits and flat panel displays. Specifically, the present invention relates to methods and apparatuses for cooling a rotating element in or about a process chamber of a vacuum processing system.

2. Background of the Related Art

Vacuum processing systems for processing 150 mm, 200 mm, 300 mm or other size wafers, or substrates, are generally known. A vacuum processing system typically has a centralized transfer chamber mounted on a monolith platform. The transfer chamber is the center of activity for the movement of wafers being processed in the system. Some transfer chambers have multiple facets for mounting chambers of various different types, including process chambers. The process chambers include, among others, rapid thermal processing (RTP) chambers, physical vapor deposition (PVD) chambers, chemical vapor deposition (CVD) chambers, and etch chambers. The process chambers perform various processes on the substrates to form integrated circuits or other structures.

The processes for fabricating IC's or other structures on a substrate, or wafer, typically involve operating in a vacuum environment in a process chamber. Additionally, many of these processes involve generating an ionized plasma discharge in a region of the chamber near the substrate either to strike the substrate with the ions or strike a target to sputter the target material onto the substrate. For example, a physical vapor deposition process typically generates a plasma discharge between a wafer and a target in a very high vacuum. The positive ions in the plasma discharge are accelerated toward the target to dislodge the target material, which then deposits onto the substrate. For example, in order to sputter copper or aluminum onto a wafer, a target fabricated with a copper or aluminum material is mounted in the PVD chamber. A wafer is positioned near the target. A plasma of ions, typically of argon, is struck in the space between the wafer and the target. The ions are accelerated toward the target. The target material is knocked loose from the target and travels onto the surface of the wafer, thereby depositing a thin film of the target material on the wafer. Electrons in the plasma material, along with secondary electrons dislodged from the target material, are attracted to a grounded surface in the chamber, but before these electrons are captured by the grounded surface they typically undergo a sufficient number of ionizing collisions in the plasma to maintain the plasma discharge.

Among other methods, plasma discharges are typically formed in the process chamber by RF voltages, microwaves or planar magnetrons or a combination of techniques. A planar magnetron system, for example, uses a rotating magnetron disposed above a target, and either a dc bias between the target and the substrate or an RF source, coupled into the space between the target and substrate, for powering the discharge to form the plasma. The magnetron is a magnet structure which provides magnetic field lines parallel to, and spaced to the plasma side, of the sputter surface of the target. A negative dc bias voltage between the target and the plasma region accelerates the ions toward the target to dislodge the target material therefrom. The magnetic field from the magnetron confines the free electrons, including the secondary electrons from the target material, near the target to maximize the ionizing collisions by the free electrons with the plasma material before the free electrons are lost to a grounded surface. Where the magnetron is one or more fixed magnets, they typically rotate around the backside, non-sputter side, of the target to evenly spread the magnetic field around the surface of target to result in an even sputtering of the target material.

A simplified example of a PVD chamber 100 is shown in FIG. 1a. Generally, the PVD chamber 100 comprises a substrate support member 102, a target 104 and a magnetron 108. The magnetron is disposed within a cooling chamber 116. The cooling chamber 116 is defined by a top 117, sides 119 and the target 104. A cooling fluid, such as water, flows through the cooling chamber 116.

FIG. 1b shows the magnetron 108. The magnetron 108 has a magnet assembly including several magnets 110. Two stainless steel poles 109, 111 cover the top and the bottom of the magnets 110 to effectively create a more uniform magnetic field across the magnetron 108.

A wafer (not shown) is placed on the substrate support member 102 and raised to a position near the target 104 inside the chamber section 106. The pump section 122, typically a cryopump, pumps the chamber 100 down to a very high vacuum. A motor assembly 112 provides rotational motion to the magnetron 108 through a shaft 114 to rotate the magnetron 108 at about 100 rpm. The plasma is struck in the space between the wafer and the target 104, and ions in the plasma strike the target 104.

The process may heat up the target 104 and the magnetron 108 to about 110° C.–120° C. and about 130° C.–140° C., respectively. If the magnetron 108 and/or the target 104 are heated above the proper temperatures, then the high temperature may alter the performance of the process giving undesirable results and lessening the useful lives of the magnetron 108 and the target 104. At high temperatures, the plasma density and energy may change to alter the sputtering rate or uniformity on the target or the substrate, thereby providing unpredictable results in the process. Additionally, the excessive heat may cause the mechanical features of the magnetron 108 to wear out prematurely. Therefore, water, or other cooling fluid, in the cooling chamber 116 is used to cool the target 104 and the magnetron 108.

The water enters the cooling chamber 116 at an inlet 118, circulates around the magnetron 108 and exits at an outlet 120. The arrows A–F show generalized water flow paths around the magnetron 108. A problem is that the space between the magnetron 108 and the target 104 is only about one millimeter, so very little cooling water can flow therebetween. Thus, it is very difficult to cool this area. Additionally, the rotational motion of the magnetron 108 and frictional engagement of the water therewith creates a centrifugal force to try to push the water away from the rotational center of the magnetron 108 and toward its outer edge. This action of the magnetron 108 causes further difficulties in circulating the water between the magnetron 108 and the target 104. Also, this action of the magnetron 108 combined with the heat generated at the magnetron's rotational center causes water vapor bubbles to form near the rotational center, an effect known as cavitation. These water vapor bubbles cause an abrasive action on the magnets 110 and cause the magnets 110 to wear.

A need, therefore, exists for a process chamber with a mechanism for enhancing the flow of cooling fluid between a rotating member, such as a magnetron in a PVD chamber, and a surface, such as the top side of a sputtering target.

SUMMARY OF THE INVENTION

A vacuum processing system has a process chamber with a rotating member, such as a magnetron in a PVD chamber, disposed in a cooling chamber containing a cooling fluid, such as water, that circulates into and out of the cooling chamber. The rotating member is situated very close to a surface, such as the top side of the target in the PVD chamber. The rotational motion of the magnetron induces the cooling fluid to flow through a fluid conduit in the magnetron from one side of the magnetron to another side, thereby circulating the cooling fluid around the magnetron. The fluid conduit extends from a position near the rotational center of the magnetron to a position near the outer edge of the magnetron. Thus, the rotational motion generates a centrifugal force in the cooling fluid in the conduit, so the cooling fluid flows from the central position to the outer position under the action of this force.

On one side of the magnetron, the fluid conduit includes a fluid channel extending from the position near the rotational center to the position near the outer edge. The fluid conduit also includes a fluid passageway extending from the fluid channel near the rotational center through the magnetron to the other side of the magnetron, where it is open to the cooling fluid at a position near the rotational center of the magnetron on the side close to the surface. The rotational motion of the magnetron generates the centrifugal force in the cooling fluid in the fluid channel, which draws the cooling fluid through the fluid passageway from the space between the magnetron and the surface and expels the cooling fluid on the opposite side of the magnetron near its outer edge. Thus, the magnetron performs as its own centrifugal pump to circulate the cooling fluid around itself by pumping the cooling fluid from the center of the magnetron between the magnetron and the target to the outer edge of the magnetron on the opposite side of the magnetron, thereby forcing cooling fluid to flow between the magnetron and target from the outer edge of the magnetron to the middle of the magnetron.

The fluid channel curves from the central position to the outer position in the direction of the relative motion of the cooling fluid to enhance the action of the centrifugal pump. Also, the fluid channel opens near the outer edge at an angle partially facing in the direction of the cooling fluid's relative motion, so the opening faces partially toward the low pressure region of the cooling fluid on the trailing side of the fluid channel.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 2:
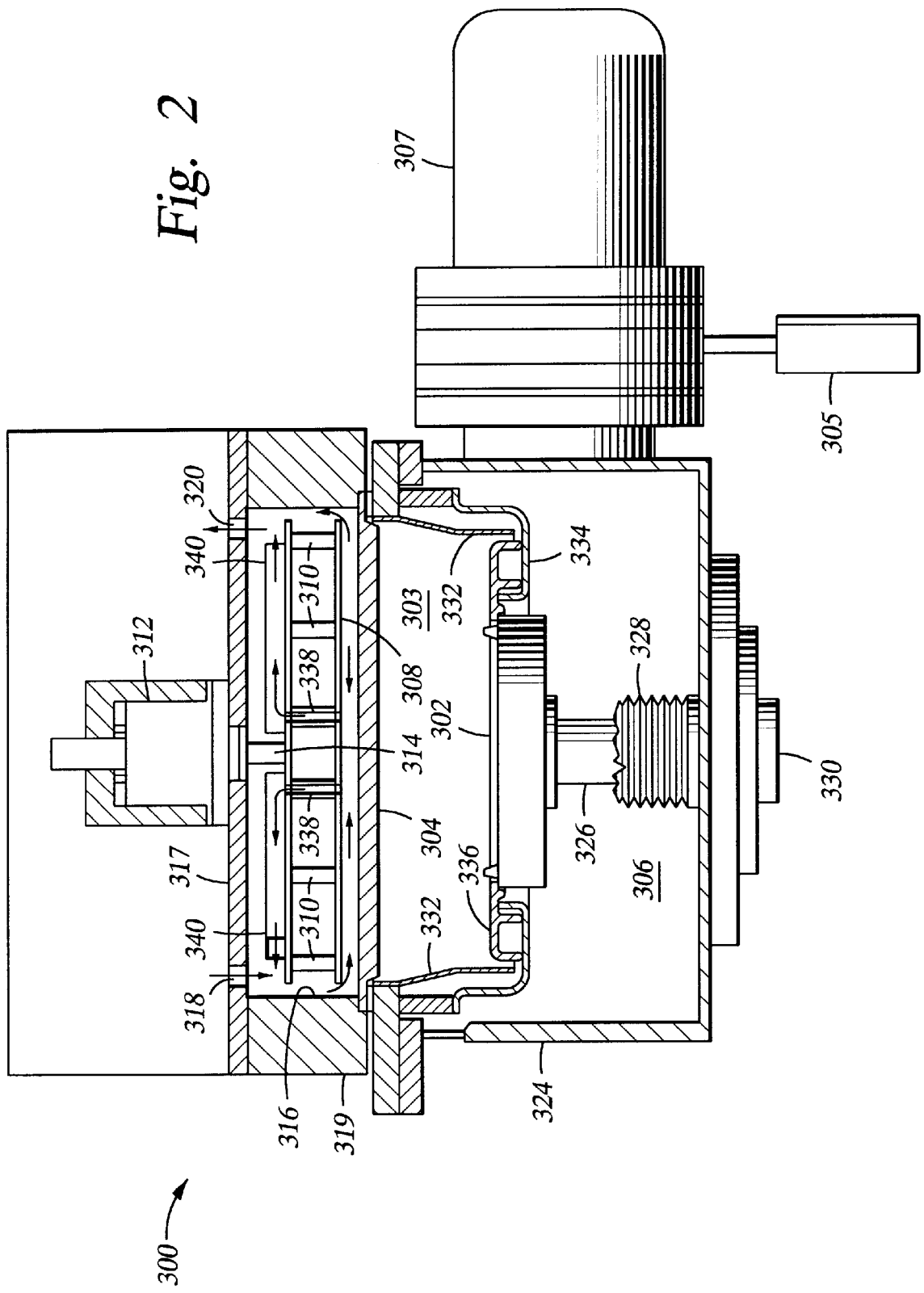
FIG. 2 is a side view of a process chamber.

FIG. 2 shows a simplified example of a PVD chamber 300. The PVD chamber 300 generally includes a chamber section 306 and a pump section 307. The chamber section 306 generally includes a substrate support member 302 for supporting a substrate (not shown) to be processed, a target 304 for providing a material to be deposited on the substrate and a process environment 303 wherein a plasma is created for ions to sputter the target 304. Although the below described magnetron and cooling system will be described with reference to a process chamber having the configuration of the PVD chamber 300, it is understood that the invention is not so limited. Rather, the process chamber may be any type of process chamber and may be configured with the substrate support member and process environment above or to the side of as well as below the target. Thus, any indications of up, down or other directions are only references and not meant to limit the invention.

The pump section 307 typically is a cryopump, or other high vacuum pump, for pumping the chamber section 306 to a very high vacuum, so the chamber section 306 may process a substrate. A gate valve 305 is disposed between the chamber section 306 and the cryopump 307 to provide access therebetween so the cryopump 307 can reduce the pressure in the chamber section 306 and to provide isolation therebetween so the chamber section 306 may be vented.

The PVD chamber 300 generally includes the substrate support member 302, also known as a susceptor or heater, disposed within the chamber section 306 for receiving the substrate from the transfer chamber 202. The substrate support member 302 may heat the substrate if required by the process being performed. A target 304 is disposed in the top of the chamber section 306 to provide material, such as aluminum, titanium or tungsten, to be sputtered onto the substrate during processing by the PVD chamber 300. A lift mechanism, including a guide rod 326, a bellows 328 and a lift actuator 330 mounted to the bottom of the chamber section 306, raises the substrate support member 302 to the target 304 for the PVD chamber 300 to perform the process and lowers the substrate support member 302 to exchange substrates. A set of shields 332, 334, 336, disposed within the chamber section 306, surround the substrate support member 302 and the substrate during processing in order to prevent the target material from depositing on the edge of the substrate and on other surfaces inside the chamber section 306.

Situated above the chamber section 306 and sealed from the processing region of the chamber is a cooling chamber 316. The cooling chamber 316 is generally defined by the target 304, a top 317 and sides 319. A cooling fluid, such as water or antifreeze, flows into the cooling chamber 316 through inlet 318 and out of the cooling chamber 316 through outlet 320, at a rate of about three gallons per minute.

A rotating magnetron 308 is disposed in the cooling chamber 316 on the non-process environment side of the target 304 and surrounded by the cooling fluid. The magnetron 308 is isolated from the vacuum in the chamber section 306 by seals (not shown) between the magnetron chamber and target and between the target and processing region. The magnetron 308 has a set of magnets 310 arranged within the magnetron 308 so that they create magnetic field lines spinning across the sputtering surface of the target. Electrons are captured along these lines, where they collide with gas atoms, creating ions. To create this effect about the circumference of the target, the target is rotated during processing. The magnetron 308 is situated above the top side of the target 304 with about a one millimeter gap therebetween, so the magnetic fields from the magnets 310 may penetrate through the target 304. A motor assembly 312 for rotating the magnetron 308 is mounted to the top 317 of the cooling chamber 316. A shaft 314, which mechanically couples the motor assembly 312 to the rotational center of the magnetron 308, extends through the top 317. The motor assembly 312 imparts a rotational motion to the magnetron 308 to cause it to spin at about 100 rpm during performance of the wafer process.

A negative dc bias voltage of about 200 V or more is typically applied to the target 304, and a ground is applied to an anode, the substrate support member 302, and the chamber surfaces. The combined action of the dc bias and the rotating magnetron 308 generate an ionized plasma discharge in a process gas, such as argon, between the target 304 and the substrate. The positively charged ions are attracted to the target 304 and strike the target 304 with sufficient energy to dislodge atoms of the target material, which sputters onto the substrate. The freed electrons from the process gas and secondary electrons from the target undergo sufficient collisions to maintain the plasma discharge in the process gas because the magnetic fields of the magnetron 308 confine the electrons to a region close to the target in order to maximize the opportunity for ionizing collisions near the target before the electrons are lost to a grounded surface. In this manner, the magnetron 308 also "shapes" the plasma typically into a circular plasma ring in a containment field near the target.

The action of the bias voltage and the magnetic fields causes a considerable amount of the energy of the process to be dissipated at the target 304 and magnetron 308. Thus, despite being cooled, the target 304 may heat up to about 130° C.–140° C. during substrate processing, and the magnetron 308 may heat up to about 110° C.–120° C. Therefore, the cooling fluid must be recirculated to cool the magnetron 308 and the target 304. Generally, the rotational motion of the magnetron 308 is used to induce a cooling fluid surrounding the magnetron 308 to circulate through and around the magnetron 308, especially through the space between the magnetron 308 and the top surface of the target 304, in order to efficiently cool the magnetron 308 and the target 304. The specific flow of the cooling fluid will be described with reference to FIGS. 3–5.

Figure 1A:
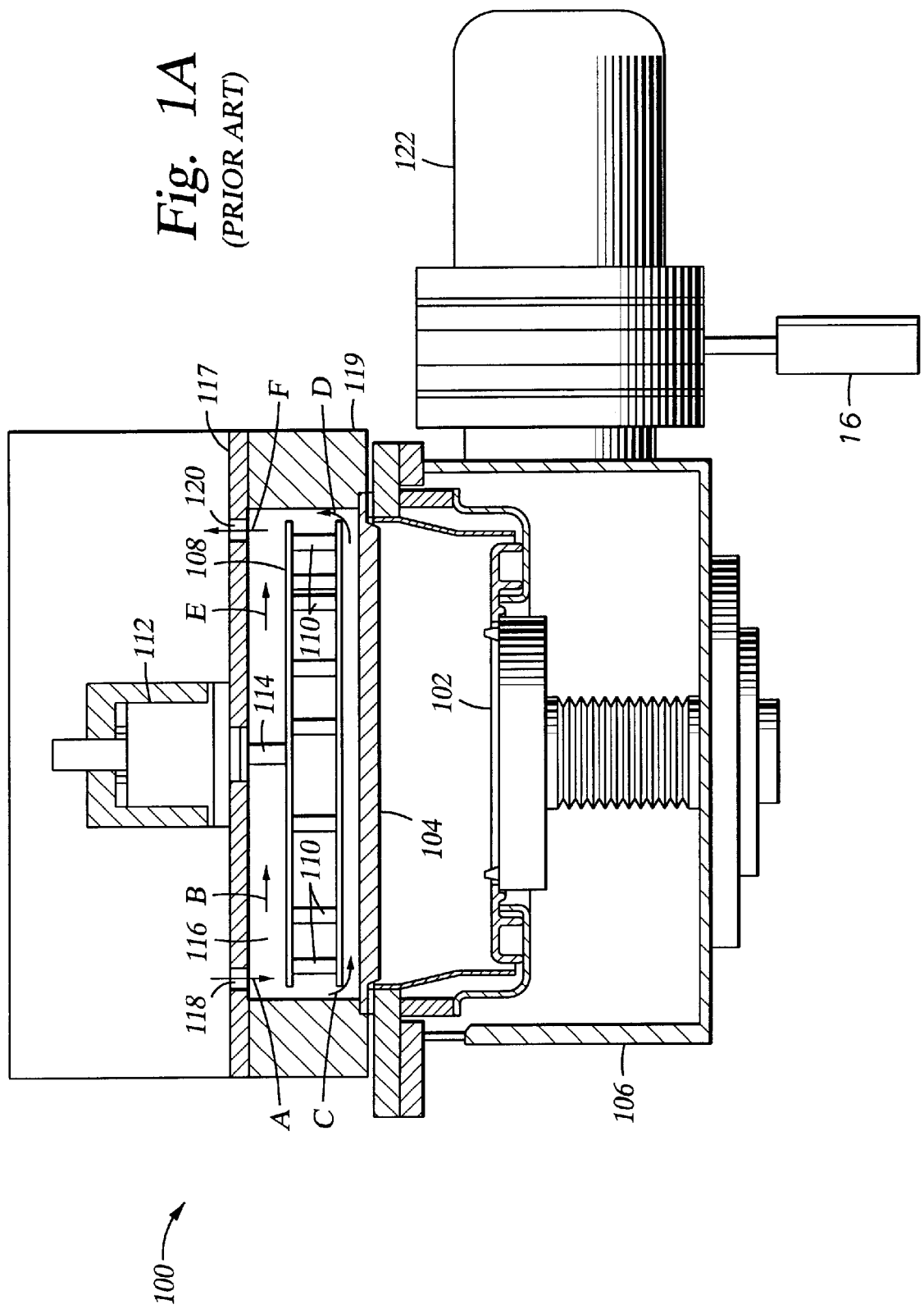
FIG. 1a is a side view of a prior art process chamber.
Figure 1B:
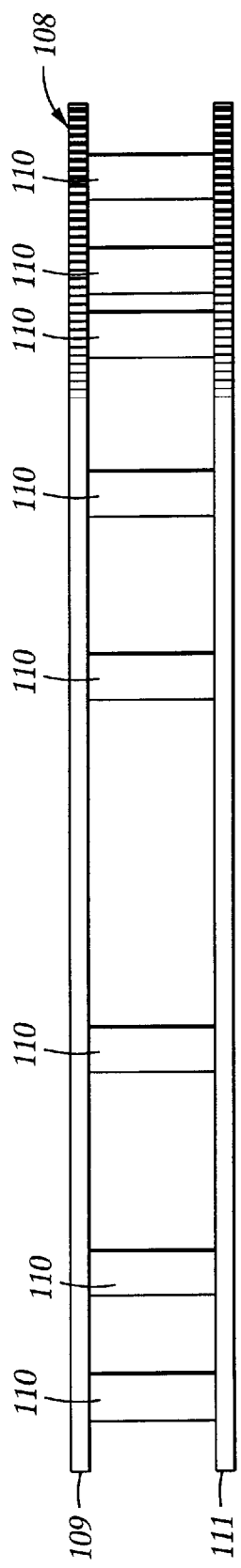
FIG. 1b is a side view of a prior art magnetron.
Figure 3:
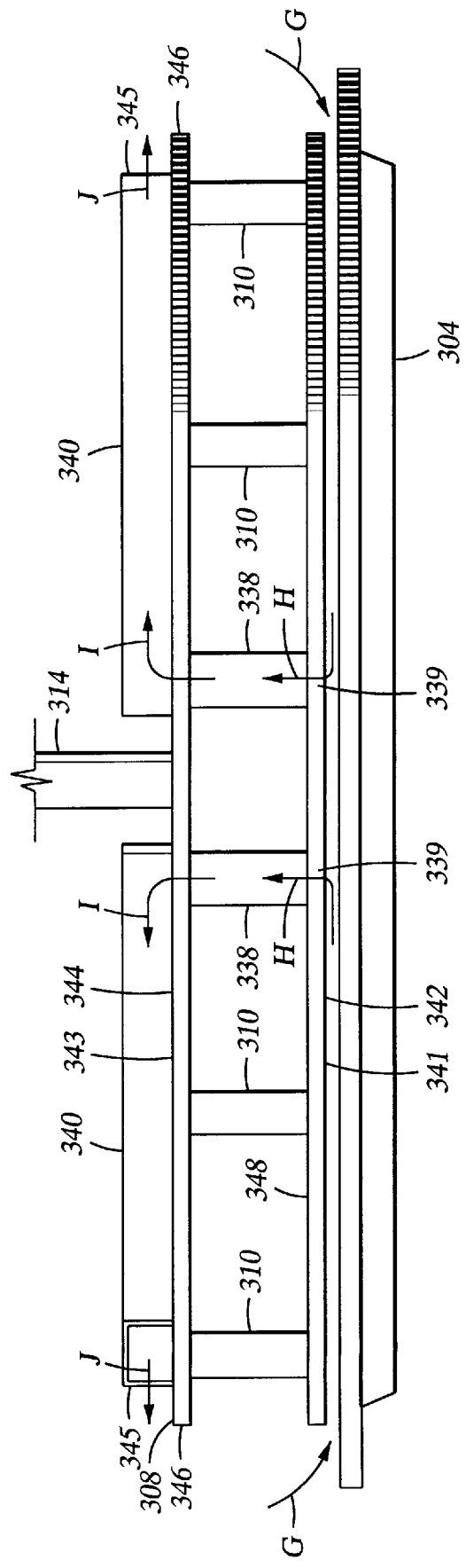
FIG. 3 is an enlarged view of a magnetron and target of the process chamber.
Figure 4:
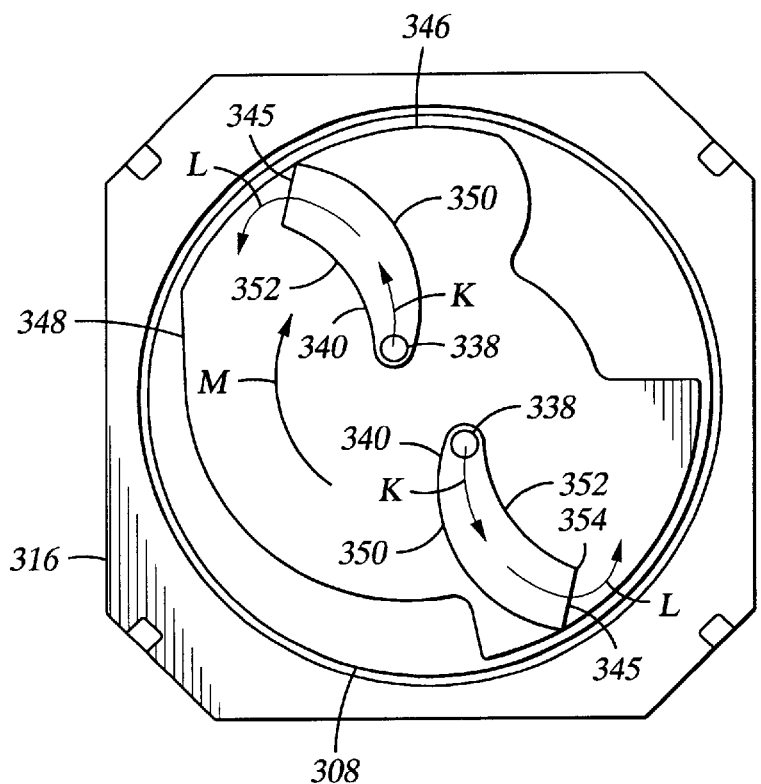
FIG. 4 is a top view of a magnetron.
Figure 5:
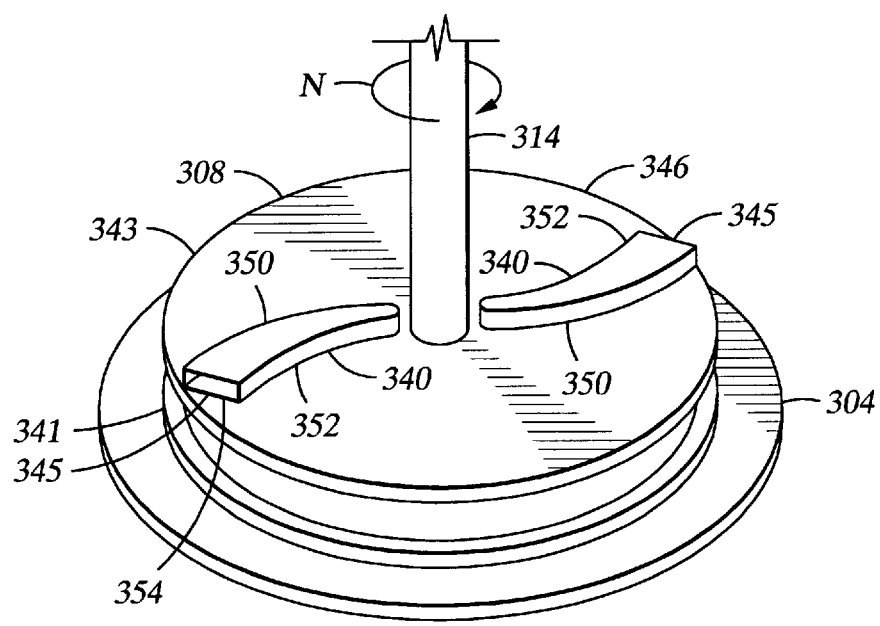
FIG. 5 is a perspective view of a magnetron and target.

The magnetron 308 and the target 304 can be seen more clearly in the enlarged view of FIG. 3 and in the top and perspective views of FIGS. 4 and 5, respectively. The magnetron 308 has a bottom plate 341 and a top plate 343 with a magnet assembly 348 thereinbetween. FIG. 4 shows the irregular shape of one embodiment for a magnet assembly 348 of the magnetron 308 within the cooling chamber 316. The magnetron 308 rotates in the direction of arrow M. Near its rotational center, the magnetron 308 has two fluid passageways, or suction tubes, 338 extending from the bottom 342 of the magnetron 308 to the top 344 of the magnetron 308. At the bottom of the magnetron 308, the passageways 338, forming a second passageway, have inlets 339 open to the space, forming a first passageway between the magnetron 308 and the target 304. At the top 344, the fluid passageways 338, forming a second passageway, open into two fluid channels 340, forming a third passageway.

Although this embodiment is shown having two fluid passageways 338 and fluid channels 340, it is understood that the present invention contemplates any number of fluid passageways 338 and fluid channels 340. The fluid channels 340 extend from the fluid passageways 338 near the rotational center of the magnetron 308 to channel openings, or outlets, 345 at the outer edge 346 of the magnetron 308. The fluid passageways 338 and the fluid channels 340 form fluid conduits through which the water flows from the space between the magnetron 308 and the target 304 near the rotational center of the magnetron 308 to the top outer edge 346 of the magnetron 308.

The fluid channels 340 are curved away from their leading edge 350. This curvature provides a hydrodynamic shape for rotating the magnetron 308 in the fluid of the cooling chamber 316. This curvature also enhances the outward flow of cooling fluid through the fluid channels 340 under the centrifugal force described below.

The rotational motion of the magnetron 308 causes a centrifugal force which induces the water in the fluid channels 340 to flow to the outer edge 346 of the top surface of the magnetron 308. The arrows G–J generally depict the flow of water between the target 304 and the magnetron 308 and through the fluid conduit 338, 340. Arrows K, L (FIG. 4) generally depict the flow of water through the fluid channels 340. The rotational motion of the magnetron 308 generates a centrifugal force in the water in the fluid channels 340 from the fluid passageways 338 to the outer edge 346. Thus, the water is forced in the directions of arrows J, K, L. Under the centrifugal force in the fluid channel 340, the water is drawn up from the space between the magnetron 308 and the target 304 through the passageway 338 in the directions of arrows H, I. The evacuation of the water from the space near the rotational center of the magnetron 308 between the target 304 and the magnetron 308 causes the water to flow inward from the outer edge of the bottom 342 of the magnetron 308 in the direction of arrow G and thereby through the space between the magnetron 308 and target 304. A space between the magnetron 308 and the sides 319 (FIG. 2) permits water to flow down beside the magnetron 308 to the bottom 342 of the magnetron 308 in order to complete the circulation of the water. The cool water flowing in through inlet 318 mixes with the warm water circulating around the magnetron 308, and the warm water flows out through the outlet 320.

In addition to the centrifugal force exerted on the water in the fluid channel 340, a pressure differential at the openings 345 induces the water to flow in the directions of arrows L. As the fluid channels 340 circulate in the direction of arrow M through the water in the cooling chamber 316, the water will flow up and over the fluid channels 340 at the leading edges 350 and will flow back down at the trailing edges 352. This action of the water will cause low pressure regions in the water following the trailing edges 352, including at the trailing corners 354 of the openings 345. The low pressure regions at the trailing corners 354 will provide a further suction force to draw the water out of the fluid channels 340 and into the general flow of the water in the cooling chamber 316.

In operation, the rotation of the magnetron 308 causes the water to flow between the magnetron 308 and the target 304. The heat from the bottom 342 of the magnetron 308 and from the target 304 transfers into the water as the water circulates. The heated water flows out through the fluid conduit 338, 340 where it is mixed with the cooler water in the cooling chamber 316. The flow of water through the inlet 318 and outlet 320 ports of the cooling chamber 316 keeps a steady supply of cool water coming into the cooling chamber 316 while heated water exits the cooling chamber 316. Thus, the magnetron 308 and the target 304 are efficiently cooled by rapidly circulating water.

Figure 6:
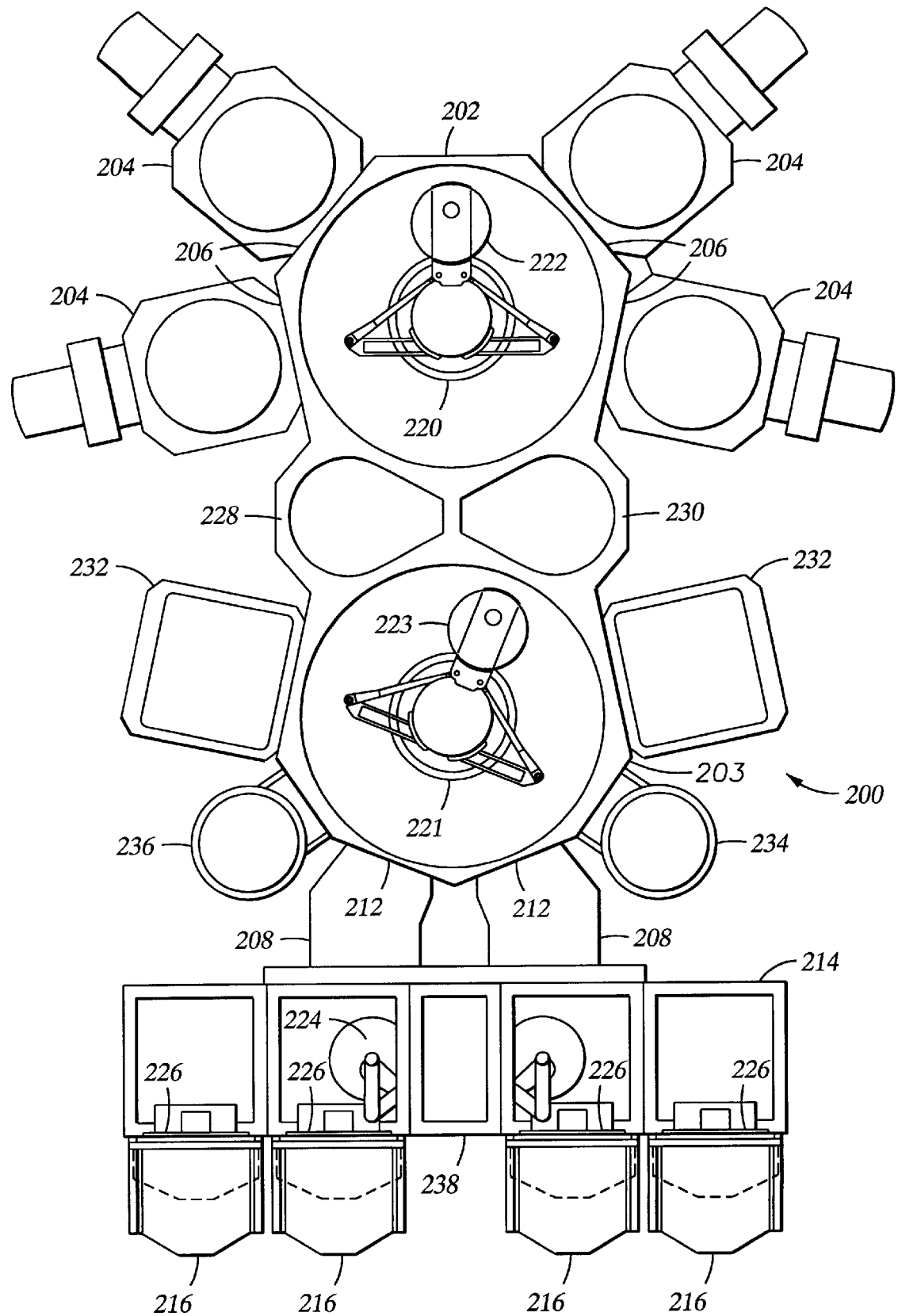
FIG. 6 is a top schematic view of a vacuum processing system.

The System:

A vacuum processing system which may incorporate the above described invention will now be described. FIG. 6 generally shows a schematic top view of an embodiment of a vacuum processing system 200. The system 200 shown in FIG. 6 is an example of the Endura ™ system available from Applied Materials, Inc. Although the invention may be practiced with this system 200, it is understood that other types of vacuum processing systems may be used with the present invention, and the present invention is not limited to any particular type of vacuum processing system. The vacuum processing system 200 includes a transfer chamber 202 and a buffer chamber 203 typically mounted on a platform (not shown) and generally forming a system monolith. The system monolith has two load lock chambers 208 mounted at facets 212. A mini-environment 214 optionally attaches to the load lock chambers 208. The transfer chamber 202 has four process chambers 204 mounted at facets 206. The process chambers 204 perform the primary wafer process on the wafers in the vacuum processing system 200. Process chambers 204 may be any type of process chamber, such as a rapid thermal processing chamber, a physical vapor deposition chamber (PVD), a chemical vapor deposition chamber, an etch chamber, etc.

The PVD chamber 300 (FIG. 2) attaches to a transfer chamber 202 at a slit valve opening (not shown) in side 324. The slit valve opening provides access for the transfer chamber robot 220 to insert or remove a wafer (not shown) into or from the chamber section 306.

The process chamber 204 may have a rotating member, such as the magnetron described above, disposed near a surface, such as the top side of a target in the PVD chamber. Even though the description above, with reference to FIGS. 2–5, depicts the rotating member and the surface as a magnetron and a target, respectively, the present invention is not so limited. Rather, the present invention may apply to any process chamber with a rotating member next to a surface.

The process chambers 204 may be supported by the transfer chamber 202 or may be supported on their own platforms depending on the configuration of the individual process chambers 204. Slit valves (not shown) in the facets 206 provide access and isolation between the transfer chamber 202 and the process chambers 204. Correspondingly, the process chambers 204 have openings (not shown) on their surfaces that align with the slit valves.

A pre-clean chamber 228 and a cool-down chamber 230 are disposed between the transfer chamber 202 and the buffer chamber 203. The pre-clean chamber 228 cleans the wafers before they enter the transfer chamber 202, and the cool-down chamber 230 cools the wafers after they have been processed in the process chambers 204. The pre-clean chamber 228 and the cool-down chamber 230 may also transition the wafers between the vacuum levels of the transfer chamber 202 and the buffer chamber 203. The buffer chamber 203 has two expansion chambers 232 for performing additional processes on the wafers. The buffer chamber 203 further has a cool-down chamber 234 for further cooling the wafers if necessary. A location for an additional chamber 236, such as a wafer aligner chamber or an additional pre-processing or post-processing chamber, is provided on the buffer chamber 203.

The load lock chambers 208 transition one wafer at a time between the ambient environment pressure to the buffer chamber vacuum pressure. Openings (not shown) in facets 212 provide access and valves provide isolation between the load lock chambers 208 and the buffer chamber 203. Correspondingly, the load lock chambers 208 have openings on their surfaces that align with the openings in facets 212. The load lock chambers 208 and the mini-environment 214 have corresponding openings (not shown) providing access therebetween, while doors (not shown) for the openings provide isolation.

Prior to the introduction of 300-mm wafers in the semiconductor processing industry, cassettes of wafers were typically loaded by human operators directly into the load lock chambers 208. Thus, a mini-environment 214 was not present in the system 200. More recently, however, semiconductor fabrication facilities have been including a mini-environment 214 to enter the wafers into the processing system 200 from cassettes of wafers transported by a factory automation handling system. The present invention contemplates incorporation in both types of systems 200.

The mini-environment 214 has four pod loaders 216 attached on its front side 238 for receiving wafer cassettes from the factory automation. Openings (not shown) with corresponding doors 226 provide access and isolation between the mini-environment 214 and the pod loaders 216. The pod loaders 216 are mounted on the side of the mini-environment 214 and are essentially shelves for supporting the wafer cassettes, or pods, (not shown) used to transport the wafers to and from the vacuum processing system 200.

A robot 220, or wafer handler, is disposed within the transfer chamber 202 for transferring a wafer 222 between the pre-clean chamber 228 and the cool-down chamber 230 and the process chambers 204. A similar robot 221 is disposed within the buffer chamber 203 for transferring a wafer 223 between the load lock chambers 208, the expansion chambers 232, the cool-down chamber 234, the additional chamber 236, the pre-clean chamber 228 and the cool-down chamber 230. Likewise, a robot 224 is disposed within the mini-environment 214 for transferring the wafers between the pod loaders 216 and the load lock chambers 208. The robot 224 is typically mounted on a track so the robot 224 can move back and forth in the mini-environment 214.

While the foregoing is directed to the preferred embodiment of the present invention, other and further embodiments of the invention may be devised without departing from the basic scope thereof, and the scope thereof is determined by the claims which follow.

We claim:

1. A process chamber comprising:
   a rotating member having a lower first side and an upper second side;
   a motor device for imparting a rotational motion to the rotating member; and
   at least one substantially horizontal fluid channel having an inlet and an outlet and connected to the rotating member and adapted to receive cooling fluid into the inlet from below the rotating member.

2. The process chamber of claim 1 wherein:
   the first side is disposed proximate to a surface and spaced therefrom to define a first passageway therebetween; and
   the cooling fluid flows through the passageway into the horizontal fluid channel inlet.

3. The process chamber of claim 1 wherein the horizontal fluid channel inlet is disposed radially inward from the outlet.

4. The process chamber of claim 1 further comprising a substantially vertical fluid channel fluidly connecting the lower first side to the upper second side wherein the fluid flows from the lower first side to the upper second side.

5. The process chamber of claim 4 wherein the cooling fluid is drawn across at least a portion of the lower first side, up through the vertical fluid channel, into the horizontal fluid channel inlet on the upper second side, through the horizontal fluid channel and out the outlet.

6. The process chamber of claim 1 wherein the horizontal fluid channel comprises at least one curved fluid channel.

7. The process chamber of claim 6 wherein the the curved fluid channel comprises a leading edge disposed in a forward rotational direction from another channel portion located near an outer periphery of the rotating member.

8. The process chamber of claim 1 wherein the rotating member comprises a magnet assembly.

9. The process chamber of claim 8 wherein the magnet assembly is disposed on a non-process environment side of a target in a physical vapor deposition chamber.

10. A magnetron for use in a process chamber comprising:

a lower first side;

an upper second side;

a rotational axis for receiving a rotational motion; and at least one substantially horizontal fluid channel having an inlet and an outlet and connected to the magnetron and adapted to receive fluid into the inlet from below the magnetron.

11. The magnetron of claim 10 wherein the horizontal fluid channel inlet is disposed radially inward from the outlet.

12. The magnetron of claim 10 further comprising a substantially vertical fluid channel fluidly connecting the lower first side to the upper second side wherein the fluid flows from the lower first side to the upper second side.

13. The magnetron of claim 12 wherein the cooling fluid is drawn across at least a portion of the lower first side, up through the vertical fluid channel, into the horizontal fluid channel inlet on the upper second side, through the horizontal fluid channel and out the outlet.

14. The magnetron of claim 10 wherein the fluid conduit comprises at least one curved fluid channel.

15. The magnetron of claim 14 wherein the curved fluid channel comprises a leading edge disposed in a forward rotational direction from another channel portion located near an outer periphery of the rotating member.

16. A vacuum processing system comprising:

a process chamber;

a transfer chamber cooperatively engaged with the process chamber;

a rotating member, capable of a rotational motion, disposed within the process chamber, the rotating member having a lower first side and an upper second side;

a motor device for imparting a rotational motion to the rotating member; and at least one substantially horizontal fluid channel having an inlet and an outlet and connected to the rotating member and adapted to receive cooling fluid into the inlet from below the rotating member.

17. The vacuum processing system of claim 16 wherein the horizontal fluid channel inlet is disposed radially inward from the outlet.

18. The vacuum processing system of claim 16 further comprising a substantially vertical fluid channel fluidly connecting the lower first side to the upper second side wherein the fluid flows from the lower first side to the upper second side.

19. The vacuum processing system of claim 18 wherein:

the cooling fluid is drawn across at least a portion of the lower first side, up through the vertical fluid channel, into the horizontal fluid channel inlet on the upper second side, through the horizontal fluid channel and out the outlet.

20. The vacuum processing system of claim 16 wherein the horizontal fluid channel comprises at least one curved fluid channel.

21. The vacuum processing system of claim 17 wherein the curved fluid channel comprises a leading edge disposed in a forward rotational direction from another channel portion located near an outer periphery of the rotating member.

22. The vacuum processing system of claim 16 wherein the rotating member comprises a magnet assembly.

23. The vacuum processing system of claim 16 wherein the lower first side is disposed proximate to a surface forming a first passageway between the lower first side and the surface, and further comprising:

a second passageway within the rotating member wherein the second passageway is adapted to allow flow of the cooling fluid from the first passageway on the lower first side through the second passageway to the upper second side; and a third passageway located on the upper second side and fluidly connected to the second passageway, the flow occurring in a direction from an outer periphery of the first passageway toward the second passageway, through at least a portion of the second passageway, and into the third passageway wherein the flow in the third passageway is in a direction radially away from the second passageway and toward the outer periphery of the upper second side.

* * * * *

UNITED STATES PATENT AND TRADEMARK OFFICE
CERTIFICATE OF CORRECTION

PATENT NO. : 5,953,827
DATED : September 21, 1999
INVENTOR(S) : David T. Or, et. al.

It is certified that error appears in the above-indentified patent and that said Letters Patent is hereby corrected as shown below:

Title page, item [56], under References Cited: replace " 9,030,264" with " 09/030,264"
replace " 9,057,254" with " 09/057,254"

Signed and Sealed this

Thirteenth Day of March, 2001

*Attest:*

NICHOLAS P. GODICI

*Attesting Officer*   *Acting Director of the United States Patent and Trademark Office*